(12) United States Patent
Balasubramanian et al.

(10) Patent No.: US 10,143,100 B2
(45) Date of Patent: Nov. 27, 2018

(54) MODULAR NETWORKING DEVICE CONNECTION SYSTEM

(71) Applicant: Dell Products L.P., Round Rock, TX (US)

(72) Inventors: Vittal Balasubramanian, San Jose, CA (US); Per Henrik Fremrot, Novato, CA (US); Joanne C. Zhang, San Jose, CA (US)

(73) Assignee: Dell Products L.P., Round Rock, TX (US)

( * ) Notice: Subject to any disclaimer, the term of this patent is extended or adjusted under 35 U.S.C. 154(b) by 49 days.

(21) Appl. No.: 15/481,207

(22) Filed: Apr. 6, 2017

(65) Prior Publication Data

US 2018/0295737 A1    Oct. 11, 2018

(51) Int. Cl.
*H05K 5/02* (2006.01)
*G06F 1/18* (2006.01)
*G06F 13/40* (2006.01)

(52) U.S. Cl.
CPC .......... *H05K 5/0256* (2013.01); *G06F 1/181* (2013.01); *G06F 1/183* (2013.01); *G06F 13/409* (2013.01)

(58) Field of Classification Search
CPC ....... H05K 5/0256; G06F 1/181; G06F 1/183; G06F 13/409
See application file for complete search history.

(56) References Cited

U.S. PATENT DOCUMENTS

| | | | | |
|---|---|---|---|---|
| 9,858,227 | B2 * | 1/2018 | Castiel | G06F 13/4022 |
| 2007/0097659 | A1 * | 5/2007 | Behrens | G06F 1/18 361/788 |
| 2010/0195289 | A1 * | 8/2010 | Hubal | G06F 1/181 361/733 |

* cited by examiner

*Primary Examiner* — James Wu
(74) *Attorney, Agent, or Firm* — Haynes and Boone, LLP

(57) ABSTRACT

A modular networking device connection system includes a modular networking system chassis that defines a modular networking device slot. An internal wall is located in immediately adjacent the modular networking device slot, and includes a internal wall connector that connects to a modular networking device positioned in the modular networking device slot. A networking processing device is located opposite the internal wall, and includes a networking processor that is mounted to a networking processing device board and coupled via at least one trace to a networking processing device connector that is mounted to the networking processing device board. The networking processing device connector is directly connected to the internal wall connector by a first cable that transmits signals received through the internal wall connector directly to the networking processing device connector for provision to the networking processor via the networking processing device board.

20 Claims, 19 Drawing Sheets

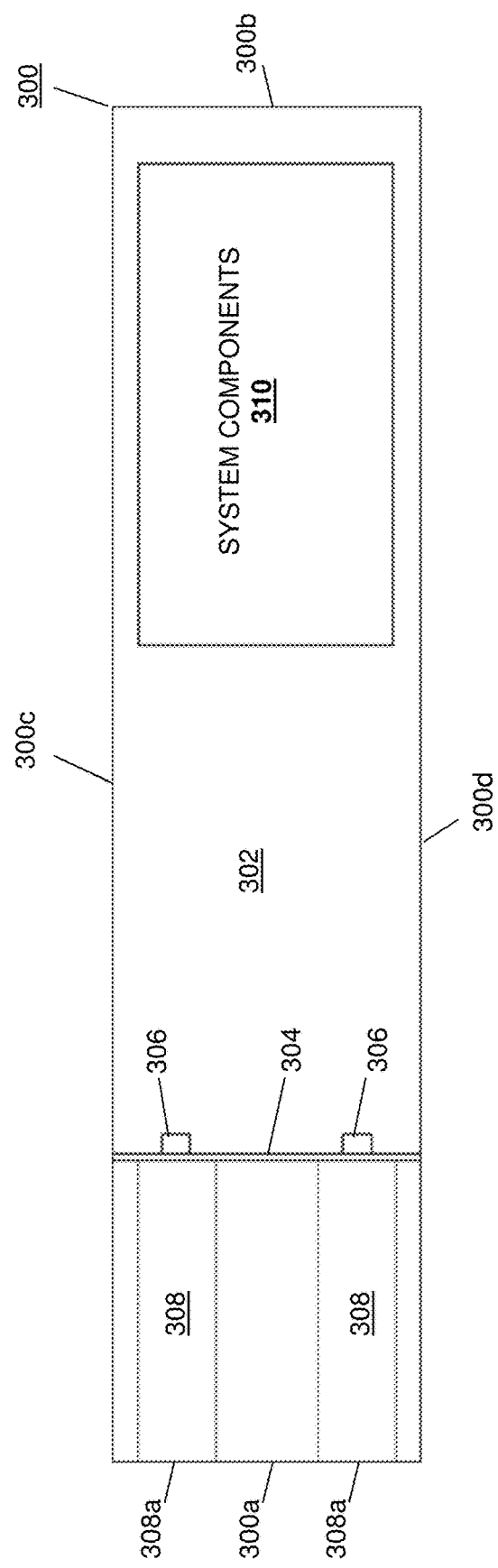

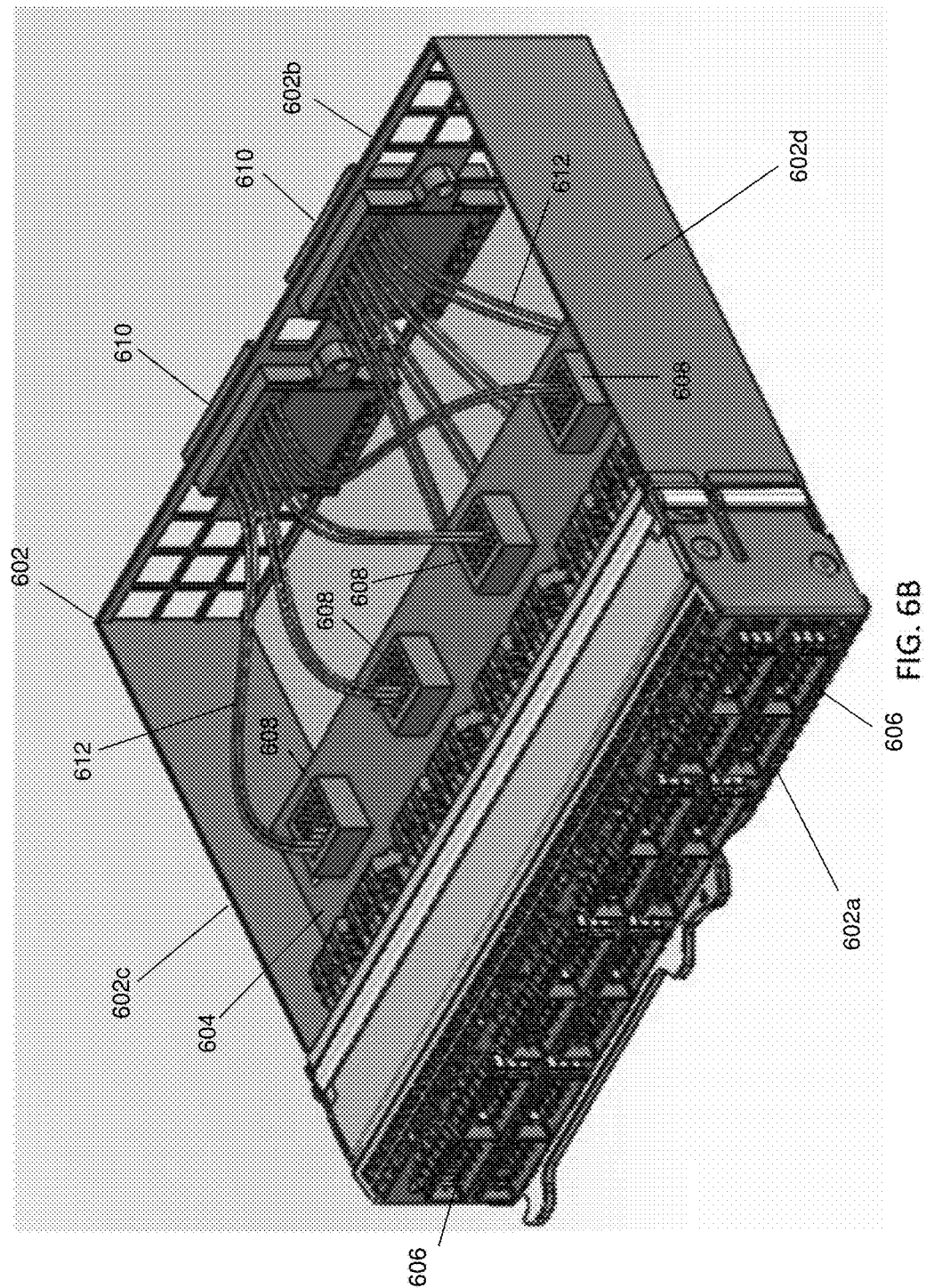

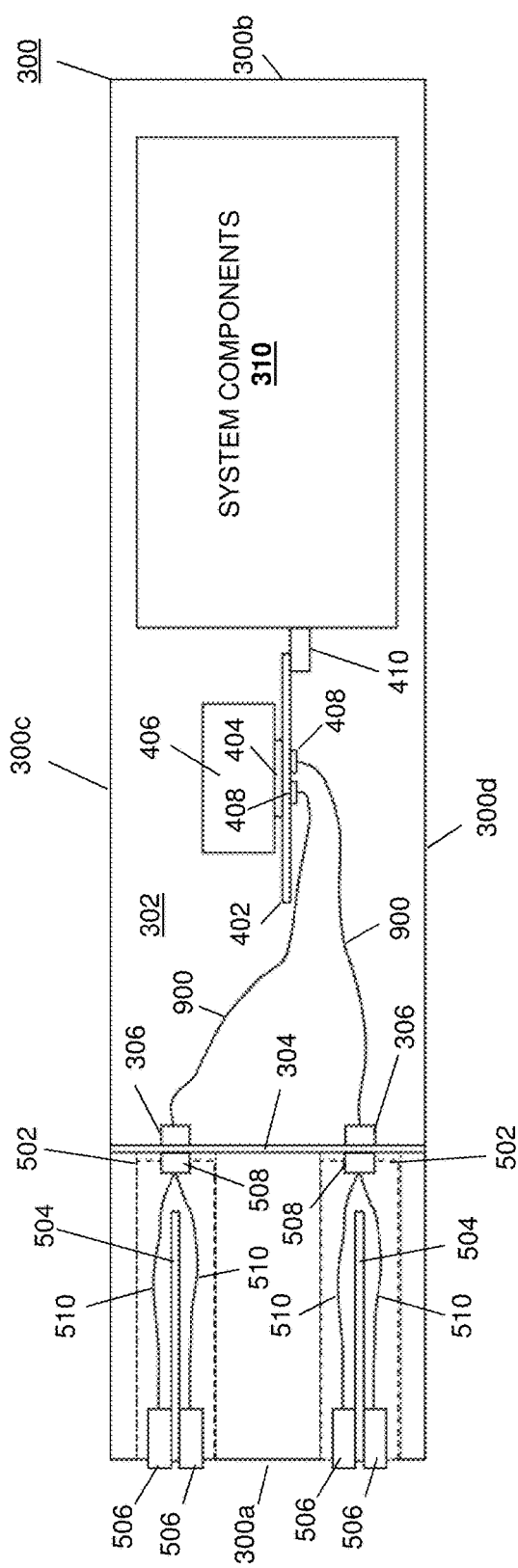

MODULAR NETWORKING DEVICE CONNECTION SYSTEM

BACKGROUND

The present disclosure relates generally to information handling systems, and more particularly to a connection system for modular networking devices in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, networking systems, sometimes include modular devices that allow those networking systems to perform networking functions. For example, switches may include modular line card devices that can be easily coupled to and decoupled from the switch in order to provide different functionality in the switch. Referring now to FIGS. 2A and 2B, components of a conventional modular switch 200 are illustrated in order to discuss conventional connections systems utilized with conventional modular line cards. The conventional modular switch 200 is illustrated as a two rack unit (2U) device with a pair of line card devices 202 that each include a line card board 202a, a plurality of external line card connectors 202b mounted to the line card board 202a, a plurality of internal line card connectors 202c mounted to the line card board 202a, and a plurality of physical layer (PHY) devices mounted to the line card board 202a, with traces in the line card board 202a extending between the external line card connectors 202b and the PHY devices 202d, as well as between the PHY devices 202d and the internal line card connectors 202c.

The conventional modular switch 200 also includes a switching/route processing device 204 that includes a switching/route processing board 204a, a plurality of first internal switching/route processing connectors 204b mounted to the switching/route processing board 204a, a plurality of second internal switching/route processing connectors 204c mounted to the switching/route processing board 204a, a switching/route processing processor 204d mounted to the switching/route processing board 204a, and a heat sink 204e engaging the switching/route processing processor 204d, with traces in the switching/route processing board 204a extending between the first switching/route processing connectors 204b and the switching/route processing processor 204d, as well as between the switching/route processing processor 204d and the second switching/route processing connectors 204c. The conventional modular switch 200 also includes a pair of connection devices 206 that each include a connection device board 206a, a plurality of first internal connection device connectors 206b mounted to the connection device board 206a, and a plurality of second internal connection device connectors 206c mounted to the connection device board 206a, with traces in the connection device board 206a extending between the first connection device connectors 206b and the second connection device connectors 206c. As can be seen in FIG. 2B, in the conventional modular switch 200, the line card devices 202 are coupled to the switching/route processing device 204 via the connection devices 206, and specifically by connecting the internal line card connectors 202c to the first internal connection device connectors 206b, and connecting the second internal connection device connectors 206c to the first internal switching/route processing connectors 204b. Such conventional connection systems raise a number of issues.

For example, the number of the connections (i.e., the internal line card connectors 202c to the first internal connection device connectors 206b, and the second internal connection device connectors 206c to the first internal switching/route processing connectors 204b) along with the length of the traces (i.e., in the line card board 202a, the connection device board 206a, and the switching/route processing board 204a) can induce significant power losses (e.g., on the order of 15-30 dB) that dilute the signal received and transmitted by the switching/route processing processor 204d. As such, the PHY devices 202d are required on the line card devices 202 in order to perform re-driving and/or re-timing operations that boost the signal so that it may be received and transmitted by the switching/route processing processor 204d in a condition (e.g., having a signal strength) that allows for its processing. However, such PHY devices add significant cost to the system, require additional power, produce additional heat that can cause thermal issues, and delay the transmission of the signal due to its processing by the switching/route processing processor 204d.

Accordingly, it would be desirable to provide an improved modular networking device connection system.

SUMMARY

According to one embodiment, an Information Handling System (IHS) includes a modular networking system chassis that defines a modular networking system housing; an internal wall that is located in the modular networking system housing and that includes a internal wall connector; a modular networking device that is located in the modular networking system housing and connected to the internal wall connector; and a networking processing device that is located in the modular networking system housing opposite the internal wall from the modular networking device, wherein the networking processing device includes: a networking processing device board; a networking processor that is mounted to the networking processing device board; and a networking processing device connector that is mounted to the networking processing device board and coupled to the networking processor through the networking processing device board, wherein the networking processing device connector is directly connected to the internal wall connector by a first cable that transmits signals received from the modular networking device and through the internal wall connector directly to the networking processing device connector for provision to the networking processor via the networking processing device board.

BRIEF DESCRIPTION OF THE DRAWINGS

FIG. 3 is a side/partial schematic view illustrating an embodiment of a modular networking system chassis.

FIG. 6B is a perspective view illustrating an embodiment of the modular networking device of FIG. 6A.

FIG. 10A is a side/partial schematic view illustrating an embodiment of the modular networking device of FIGS. 5A and 5B connected to the networking processing device in the modular networking system chassis of FIG. 9A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
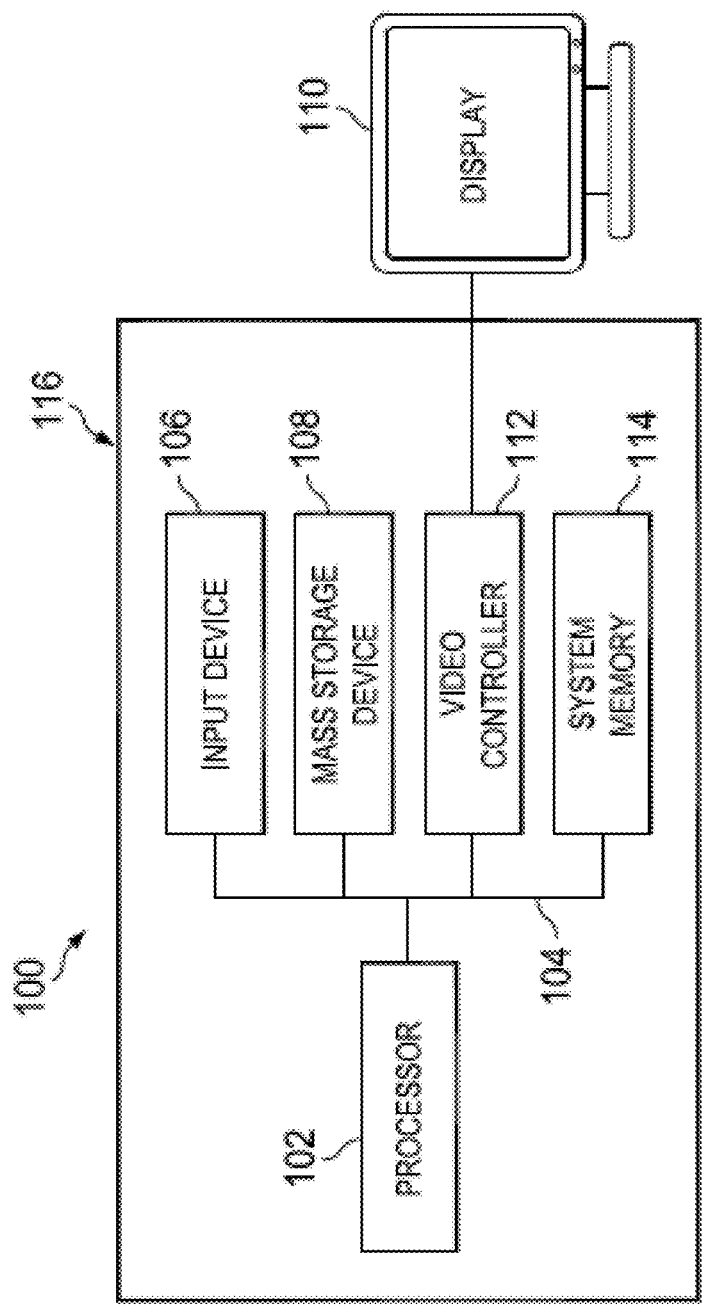
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIG. 3, an embodiment of a modular networking system chassis 300 is illustrated that includes a front wall 300a, a rear wall 300b located opposite the modular networking system chassis 300 from the front wall 300a, a top wall 300c that extends between the front wall 300a and the rear wall 300b, a bottom wall 300d located opposite the modular networking system chassis 300 from the top wall 300c and extending between the front wall 300a and the rear wall 300b, as well as side walls (not explicitly illustrated) that may be located opposite the modular networking system chassis 300 from each other and that may extend between the front wall 300a, the rear wall 300b, the top wall 300c, and the bottom wall 300d. While not illustrated, one of skill in the art in possession of the present disclosure will recognize that any of the walls on the modular networking system chassis 300 may include features for mounting, securing, or otherwise coupling the modular networking system chassis 300 to a rack or other chassis. The modular networking system chassis 300 defines a modular networking system housing 302 between the front wall 300a, the rear wall 300b, the top wall 300c, the bottom wall 300d, and the side walls. In an embodiment, the modular networking system housing 302 is configured to house the components of a modular networking system, only some of which are illustrated and described below. While the modular networking system chassis 300 is illustrated as a 2 rack unit (2U) chassis, larger or smaller chassis will fall within the scope of the present disclosure as well.

For example, in the illustrated embodiment, an internal wall 304 is located in the modular networking system housing 302, spaced apart from the front wall 300a, and extends between the top wall 300c, the bottom wall 300d, and the side walls. A plurality of internal wall connectors 306 are mounted to the internal wall 304, with subsets of the plurality of internal wall connectors 306 located adjacent corresponding modular networking device slots 308 that are provided in the modular networking system housing 302 between the front wall 300a and the internal wall 304. For example, the modular networking device slots 308 may be defined by portions of the modular networking system chassis 300 that provide for the mounting, securing, and/or otherwise coupling of module networking devices to the modular networking system chassis 300, and well as providing the internal wall connectors 306 as "blind-mate-able" connectors that connect to modular networking devices when they are moved through the modular networking device slots 308. As such, the modular networking system chassis 300 may define modular networking device slot entrances 308a adjacent the modular networking device slots 308, as well as guide members and securing members adjacent those modular networking device slots 308. In an embodiment, the plurality of internal wall connectors 306 may be EXAMAX® connectors provided by Amphenol FCI corporation of Singapore, IMPEL® connectors provided by Molex, Inc. of Illinois, United States, WHISPER® connectors provided by TE Connectivity Ltd of Switzerland, and/or a variety of other connectors that would be apparent to one of skill in the art in possession of the present disclosure. While described as a "wall", the internal wall 304 may instead be provided by any support member that is located in the modular networking system housing 302 and configured to support the internal wall connectors 306 to provide the functionality described below.

In the illustrated embodiment, a plurality of system components 310 are housed in the modular networking system housing 302 adjacent the rear wall 300b of the modular networking system chassis 300, and those system components 310 may vary depending on the modular networking system. For example, the system components 310 may include power supply components, connector components, processing components, memory components, and/or a variety of other components that would be apparent to one of skill in the art in possession of the present disclosure. As such, while the system components 310 are illustrated as located entirely within the modular networking system housing 302, at least a portion of those system components 310 may be accessible outside of the modular networking system chassis 300 (e.g., on the rear wall 300b of the modular networking system chassis 302 in the case of connectors). While a specific modular networking system chassis has been illustrated and described, one of skill in the art in possession of the present disclosure will recognize that a modular networking system chassis may include a variety of other components that will fall within the scope of the present disclosure, and may be replaced with other types of computing chassis may utilize the teachings of the present disclosure while remaining within its scope.

Figure 4:
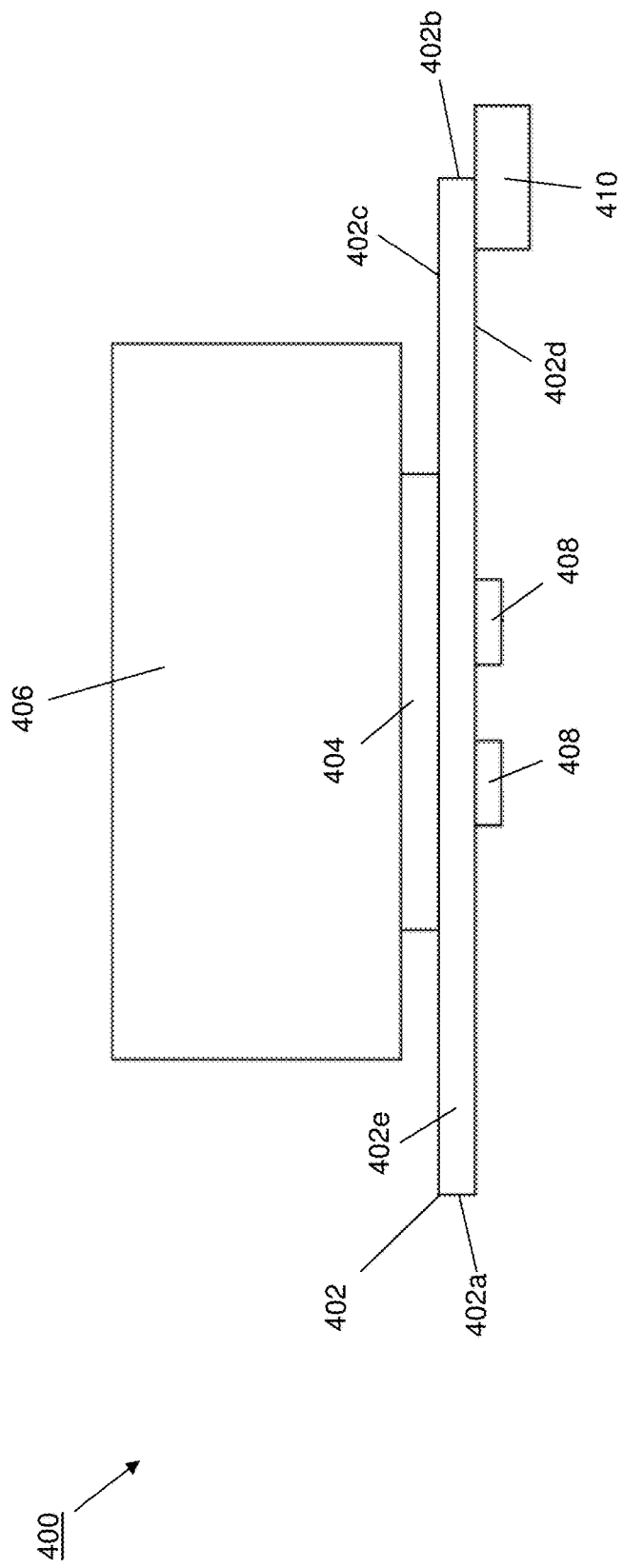
FIG. 4 is a side view illustrating an embodiment of a networking processing device.

Referring now to FIG. 4, an embodiment of a networking processing device 400 is illustrated that may be utilized in the modular networking system chassis 300 discussed above with reference to FIG. 3. In the illustrated embodiment, the networking processing device 400 includes a networking processing device board 402 (e.g., a circuit board) that includes a front surface 402a, a rear surface 402b located opposite the networking processing device board 402 from the front surface 402a, a top surface 402c that extends between the front surface 402a and the rear surface 402b, a bottom surface 402d located opposite the networking processing device board 402 from the top surface 402c and extending between the front surface 402a and the rear surface 402b, as well as side surfaces 402e and 402f that are located opposite the networking processing device board 402 from each other and that extend between the front surface 402a, the rear surface 402b, the top surface 402c, and the bottom surface 402d. A networking processor 404 is mounted to the top surface 404c of the networking processing device board 402, and may include a networking Application Specific Integrated Circuit (ASIC) that is configured to perform switching and/or route processing functionality, or a variety of other processors known in the art. A heat sink 406 is thermally coupled to the networking processor 404.

A plurality of networking processing device connectors 408 are mounted to the bottom surface 402d of the networking processing device board 402. In an embodiment, the plurality of networking processing device connectors 408 may be provided by EXAMAX® connectors provided by Amphenol FCI corporation of Singapore, IMPEL® and/or SLIMSTACK® connectors provided by Molex, Inc. of Illinois, United States, WHISPER® and/or SILVER® connectors provided by TE Connectivity Ltd of Switzerland, DCH® connectors provided by SAMTEC, Inc. of Indiana, United States, and/or a variety of other connectors that would be apparent to one of skill in the art in possession of the present disclosure. While the networking processing device connectors 408 are illustrated as mounted on the bottom surface 402d of the networking processing device board 402, the positioning of the networking processing device connectors 408 on the networking processing device board 402 may change (e.g., to being mounted on the top surface 402c if the heat sink 406 will allow for accessing them.) One or more traces or other connections may be provided in the networking processing device board 402 to couple each to the networking processing device connectors 408 to the networking processor 404. One or more system component connectors 410 are mounted to the bottom surface 402d of the networking processing device board 402 adjacent to and extending beyond the rear surface 402b of the networking processing device board 402. However, the component connectors 410 may be mounted to the top surface 402c of the networking processing device board 402 while remaining within the scope of the present disclosure. One or more traces or other connections may be provided in the networking processing device board 402 to couple each to the system component connectors 410 to the networking processor 404. In the embodiments discussed below, the networking processing device 400 is described as a switching/route processing device, but one of skill in the art in possession of the present disclosure will recognize that other types of devices that perform other functions may benefit from the teachings of the present disclosure and thus will fall within its scope.

Figure 5A:
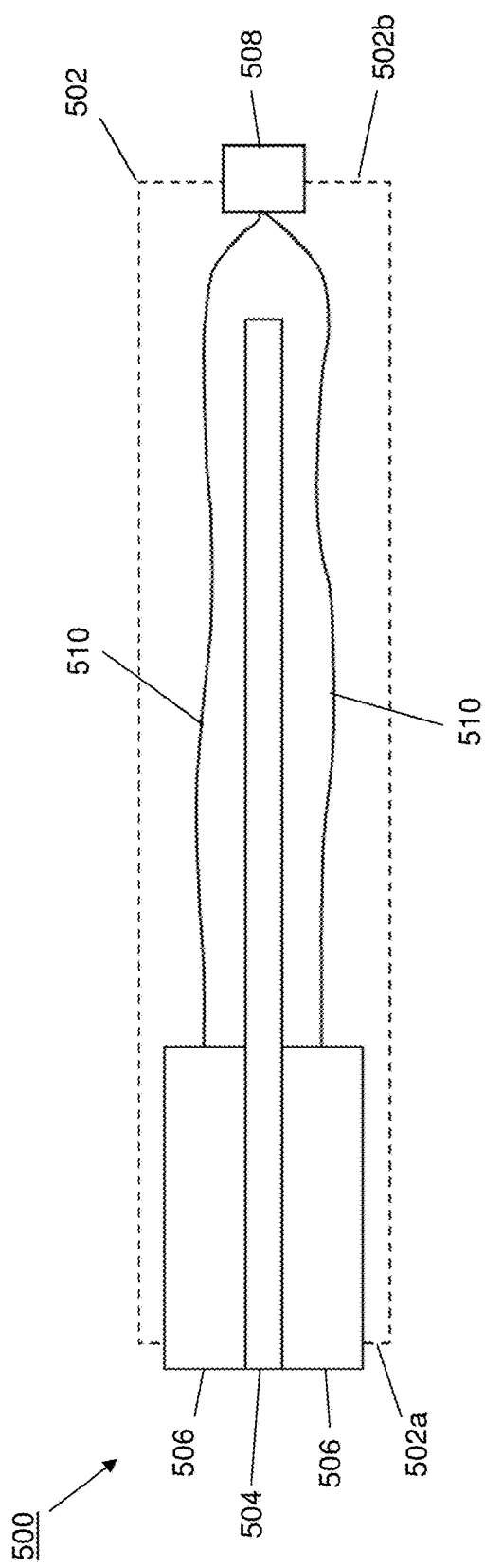
FIG. 5A is a side view illustrating an embodiment of a modular networking device.
Figure 5B:
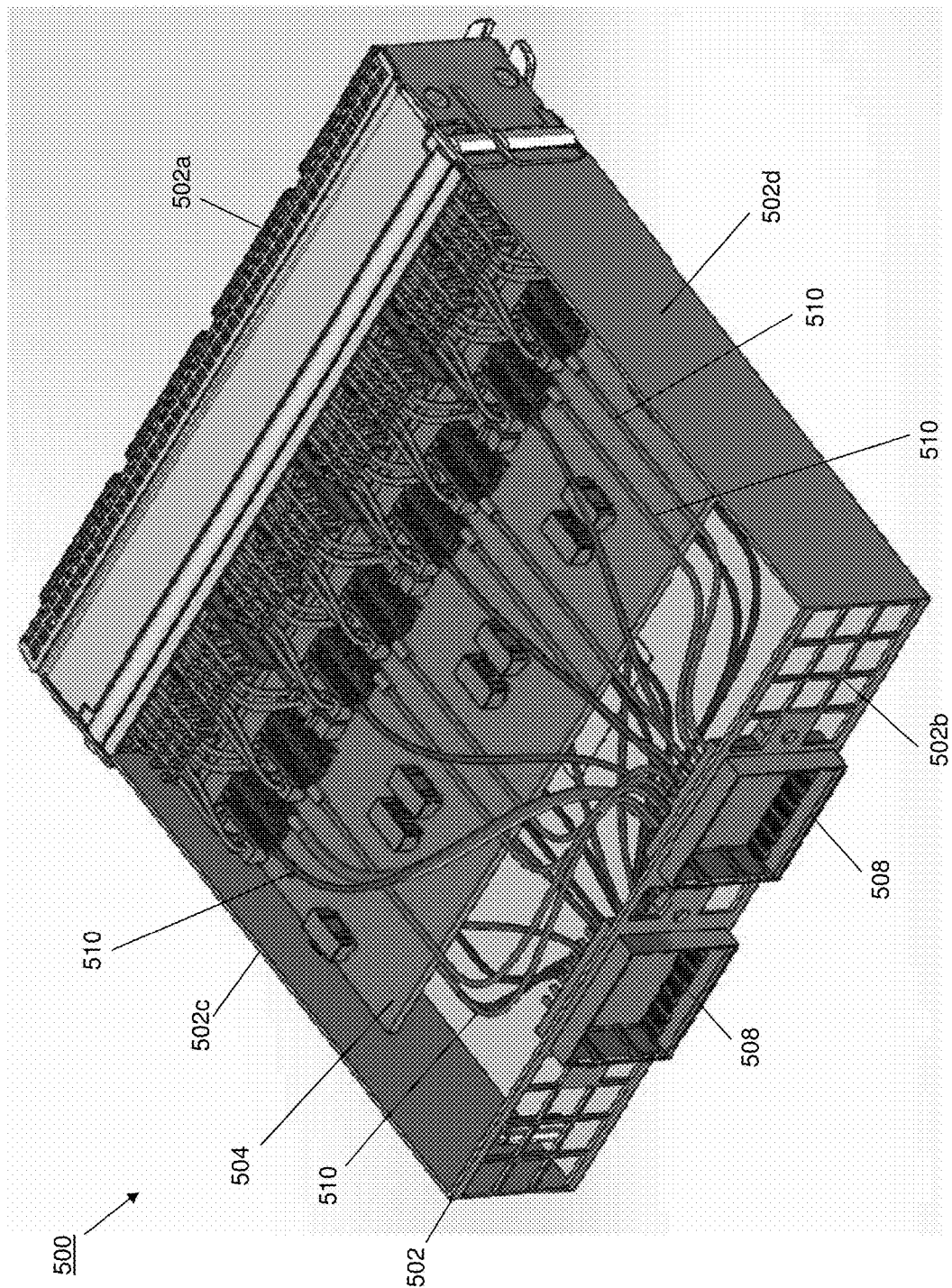
FIG. 5B is a perspective view illustrating an embodiment of the modular networking device of FIG. 5A.

Referring now to FIGS. 5A and 5B, an embodiment of a modular networking device 500 is illustrated that may be utilized in the modular networking system chassis 300 discussed above with reference to FIG. 3. In the illustrated embodiment, the modular networking device 500 includes a modular networking device chassis 502 having a front wall 502a, a rear wall 502b located opposite the modular networking device chassis 502 from the front wall 502a, a side wall 502c that extends between the front wall 502a and the rear wall 502b, and a side wall 502d located opposite the modular networking device chassis 502 from the side wall 502c and extending between the front wall 502a and the rear wall 502b. A modular networking device board 504 (e.g., a circuit board) is mounted in the modular networking device chassis 502, and in the illustrated embodiment the modular networking device board 504 extends between the front wall 502a and portions of the side walls 502c and 502d of the modular networking device chassis 502, while being spaced apart from the rear wall 502b of the modular networking device chassis 502.

A plurality of modular networking device external connectors 506 are mounted to opposite surfaces on the modular networking device board 504 such that they are accessible on the modular networking device chassis 502 (e.g., by extending past the front wall 502a of the modular networking device chassis 502 as illustrated). In an embodiment, the plurality of modular networking device external connectors 506 may be provided by Small Form-factor Pluggable (SFP) connectors such as SFP+ connectors, SFP 28 connectors, and SFP 56 connectors; Quad-SFP (QSFP) connectors such as QSFP+ connectors, QSFP28 connectors, and Double Density QSFP (QSFP-DD) connectors; Octal SFP (OSFP) connectors, other cabled Input-Output (I/O) connectors, other connectors that are configured to be connected to a twinax cable, and/or a variety of other connectors known in the art. A plurality of modular networking device internal connectors 508 are mounted to the rear wall 502b of the modular networking device chassis 502 such that they extend past the rear wall 502b of the modular networking device chassis 502 as illustrated. In an embodiment, the plurality of modular networking device internal connectors 508 may be provided by EXAMAX® connectors provided by Amphenol FCI corporation of Singapore, IMPEL® connectors provided by Molex, Inc. of Illinois, United States, WHISPER® connectors provided by TE Connectivity Ltd of Switzerland, DCH® connectors provided by SAMTEC, Inc. of Indiana, United States, and/or a variety of other connectors that would be apparent to one of skill in the art in possession of the present disclosure.

In the embodiment of the modular networking device 500 illustrated in FIGS. 5A and 5B, each of the plurality of modular networking device external connectors 506 are directly connected to at least one of the plurality of modular networking device internal connectors 508 by at least one cable 510. Furthermore, in the embodiment of the modular networking device 500 illustrated in FIGS. 5A and 5B, the modular networking device 500 is free of a signal-boosting physical layer (PHY) device, as the need to boost any signals received by the modular networking device 500 is eliminated via the teachings of the present disclosure. However, other functionality performed using PHY devices may be desirable in the modular networking device 500 and, as such, some embodiments of the modular networking device 500 may include a PHY device mounted to the modular networking device board 504. In the embodiments discussed below, the modular networking device 500 is described as a modular line card device, but one of skill in the art in possession of the present disclosure will recognize that a variety of other modular devices may benefit from the teachings of the present disclosure and thus will fall within its scope.

Figure 6A:
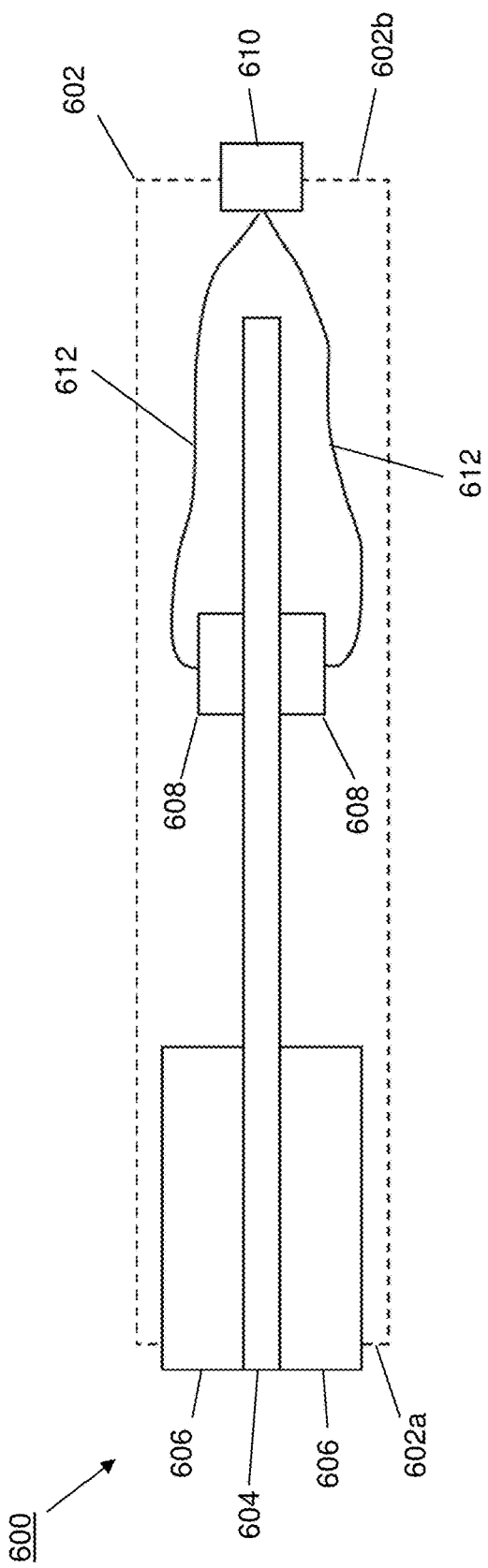
FIG. 6A is a side view illustrating an embodiment of a modular networking device.

Referring now to FIGS. 6A and 6B, another embodiment of a modular networking device 600 is illustrated that may be utilized in the modular networking system chassis 300 discussed above with reference to FIG. 3. In the illustrated embodiment, the modular networking device 600 includes a modular networking device chassis 602 having a front wall 602a, a rear wall 602b located opposite the modular networking device chassis 602 from the front wall 602a, a side wall 602c that extends between the front wall 602a and the rear wall 602b, and a side wall 602d located opposite the modular networking device chassis 602 from the side wall 602c and extending between the front wall 602a and the rear wall 602b. A modular networking device board 604 (e.g., a circuit board) is mounted in the modular networking device chassis 602, and in the illustrated embodiment the modular networking device board 604 extends between the front wall 602a and portions of the side walls 602c and 602d of the modular networking device chassis 602, while being spaced apart from the rear wall 602b of the modular networking device chassis 602.

A plurality of modular networking device external connectors 606 are mounted to opposite surfaces on the modular networking device board 604 such that they are accessible on the modular networking device chassis 602 (e.g., by extending past the front wall 602a of the modular networking device chassis 602 as illustrated). In an embodiment, the plurality of modular networking device external connectors 606 may be provided by Small Form-factor Pluggable (SFP) connectors such as SFP+ connectors, SFP 28 connectors, and SFP 56 connectors; Quad-SFP (QSFP) connectors such as QSFP+ connectors, QSFP28 connectors, and Double Density QSFP (QSFP-DD) connectors; Octal SFP (OSFP) connectors, other cabled Input-Output (I/O) connectors, other connectors that are configured to be connected to a twinax cable, and/or a variety of other connectors known in the art. A plurality of modular networking device board connectors 608 are mounted to opposite surfaces on the modular networking device board 604, and one or more traces or other connections may be provided in the modular networking device board 604 to couple each of the modular networking device external connectors 606 to at least one of the modular networking device board connectors 608. In an embodiment, the plurality of modular networking device board connectors 608 may be provided by EXAMAX® connectors provided by Amphenol FCI corporation of Singapore, IMPEL® and/or SLIMSTACK® connectors provided by Molex, Inc. of Illinois, United States, WHISPER® and/or SILVER® connectors provided by TE Connectivity Ltd of Switzerland, DCH® connectors provided by SAMTEC, Inc. of Indiana, United States, and/or a variety of other connectors that would be apparent to one of skill in the art in possession of the present disclosure. A plurality of modular networking device internal connectors 610 are mounted to the rear wall 602b of the modular networking device chassis 602 such that they extend past the rear wall 602b of the modular networking device chassis 602 as illustrated. In an embodiment, the plurality of modular networking device internal connectors 608 may be provided by EXAMAX® connectors provided by Amphenol FCI corporation of Singapore, IMPEL® and/or SLIMSTACK® connectors provided by Molex, Inc. of Illinois, United States, WHISPER® and/or SILVER® connectors provided by TE Connectivity Ltd of Switzerland, DCH® connectors provided by SAMTEC, Inc. of Indiana, United States, and/or a variety of other connectors that would be apparent to one of skill in the art in possession of the present disclosure.

In the embodiment of the modular networking device 600 illustrated in FIGS. 6A and 6B, each of the plurality of modular networking device board connectors 608 are directly connected to at least one of the plurality of modular networking device internal connectors 610 by at least one cable 612. Furthermore, the embodiment of the modular networking device 600 illustrated in FIGS. 6A and 6B is free of a signal-boosting physical layer (PHY) device, as the need to boost any signals received by the modular networking device 600 is eliminated via the teachings of the present disclosure. However, other functionality performed using PHY devices may be desirable in the modular networking device 600 and, as such, some embodiments of the modular networking device 600 may include a PHY device mounted to the modular networking device board 604. In the embodiments discussed below, the modular networking device 600 is described as a modular line card device, but one of skill in the art in possession of the present disclosure will recognize that a variety of other modular devices may benefit from the teachings of the present disclosure and thus will fall within its scope.

Figure 7:
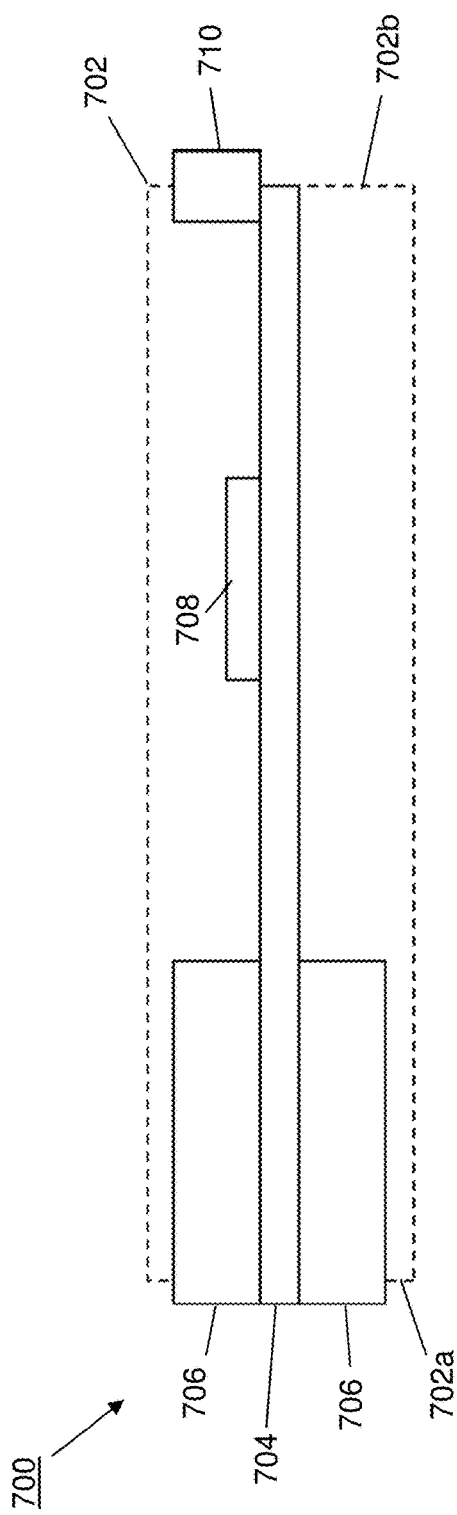
FIG. 7 is a side view illustrating an embodiment of a modular networking device.

Referring now to FIG. 7, an embodiment of a modular networking device 500 is illustrated that may be utilized in the modular networking system chassis 300 discussed above with reference to FIG. 3. In the illustrated embodiment, the modular networking device 700 includes a modular networking device chassis 702 having a front wall 702a, a rear wall 702b located opposite the modular networking device chassis 702 from the front wall 702a, as well as side walls (not explicitly illustrated) that are located opposite the modular networking device chassis 702 from each other and that extend between the front wall 702a and the rear wall 702b. A modular networking device board 704 (e.g., a circuit board) is mounted in the modular networking device chassis 702, and in the illustrated embodiment the modular networking device board 704 extends between the front wall 702a, the side walls, and the rear wall 702b of the modular networking device chassis 702.

A plurality of modular networking device external connectors 706 are mounted to opposite surfaces on the modular networking device board 704 such that they are accessible on the modular networking device chassis 702 (e.g., by extending past the front wall 702a of the modular networking device chassis 702 as illustrated). In an embodiment, the plurality of modular networking device external connectors 706 may be provided by Small Form-factor Pluggable (SFP) connectors such as SFP+ connectors, SFP 28 connectors, and SFP 56 connectors; Quad-SFP (QSFP) connectors such as QSFP+ connectors, QSFP28 connectors, and Double Density QSFP (QSFP-DD) connectors; Octal SFP (OSFP) connectors, other cabled Input-Output (I/O) connectors, other connectors that are configured to be connected to a twinax cable, and/or a variety of other connectors known in the art. In the illustrated embodiment, one or more physical layer (PHY) devices 708 are mounted to the modular networking device board 704, and one or more traces or other connections may be provided in the modular networking device board 704 to couple each of the modular networking device external connectors 706 to at least one of the PHY devices 708. A plurality of modular networking device internal connectors 710 are mounted to the rear wall 702b of the modular networking device chassis 702 such that they extend past the rear wall 702b of the modular networking device chassis 702 as illustrated. In an embodiment, the plurality of modular networking device internal connectors 710 may be provided by EXAMAX® connectors provided by Amphenol FCI corporation of Singapore, IMPEL® connectors provided by Molex, Inc. of Illinois, United States, WHISPER® connectors provided by TE Connectivity Ltd of Switzerland, DCH® connectors provided by SAMTEC, Inc. of Indiana, United States, and/or a variety of other connectors that would be apparent to one of skill in the art in possession of the present disclosure).

In the embodiment of the modular networking device 700 illustrated in FIG. 7, each of the plurality of PHY devices 708 are directly connected to at least one of the plurality of modular networking device internal connectors 710 by one or more traces or other connections provided in the modular networking device board 704. A variety of functionality may be performed using the PHY devices 708 such as, for example, signal conversion (e.g., converting between different speed signals), performing processing on relatively low speed signals, signal boosting (if desired), and/or a variety of other PHY device functionality known in the art. Furthermore, the PHY device 708 may be replaced by a processor or other device in order to perform signal analytics, encryption, etc. In a specific example, the PHY device 708 may be provided by "gearbox PHY", although other PHY devices will fall within the scope of the present disclosure as well. Furthermore, in some embodiments, the PHY device 708 may be omitted, and the modular networking device external connector 706 may be directly connected to the modular networking device internal connector 710 by one or more traces in the modular networking device board 704. In the embodiments discussed below, the modular networking device 700 is described as a modular line card device, but one of skill in the art in possession of the present disclosure will recognize that a variety of other modular devices may benefit from the teachings of the present disclosure and thus will fall within its scope.

Figure 8:
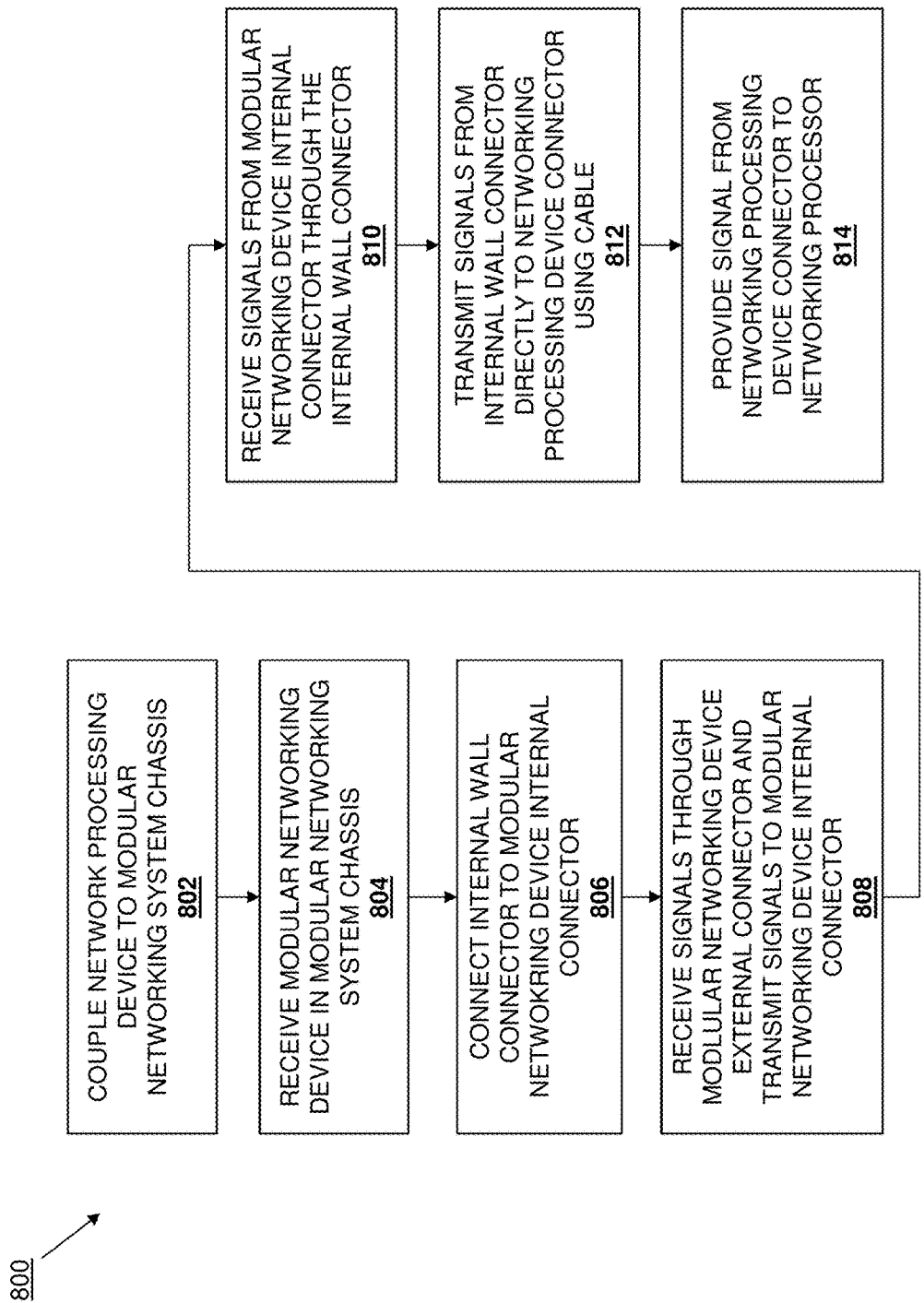
FIG. 8 is a flow chart illustrating an embodiment of a method for providing modular networking devices in a modular networking system.

Referring now to FIG. 8, an embodiment of a method 800 for providing modular devices in a modular networking system is illustrated. As discussed below, systems and methods are provided that reduce the number of the connections and the the length of the traces that are used to connect modular networking device to networking processing devices in a modular networking system, thus reducing the significant power losses that are present in conventional modular networking systems and that dilute the signal received and/or transmitted by the networking processing device. As such, signal boosting PHY devices are not required on the modular networking devices in order to perform re-driving and re-timing operations needed to boost the signal so that it may be received by the networking processing device, thus reducing costs, power, thermal issues, and signal delays. In the discussions below, several different specific examples of modular networking devices are provided to illustrate the teachings of the present disclosure, but one of skill in the art in possession of the present disclosure will recognize that features of the modular networking devices discussed below may be combined and/or provided in different combinations that will fall within the scope of the present disclosure as well.

The method 800 begins at block 802 where a networking processing device is coupled to a modular networking system chassis. With reference to FIGS. 3, 4, 9A, 9B, and 9C, at block 802 the networking processing device 400 may be positioned in the modular networking system housing 302 defined by the modular networking system chassis 300 and coupled to the system components 310 and the internal wall connectors 306 on the internal wall 304. In an embodiment, the networking processing device 400 may be coupled to the system components 310 by connecting the system component connector(s) 410 to connector(s) on the system component(s) 310. While not illustrated, the modular networking system chassis 300 may include other features (not illustrated) for supporting, coupling, and/or securing the networking processing device 400 in the modular networking system housing 302 defined by the modular networking system chassis 300. In an embodiment, the networking processing device 400 may be connected to the internal wall connectors 306 by providing cable(s) 900 that extend between the networking processing device connectors 408 and the internal wall connectors 306.

The cable(s) 900 may be connected to the networking processing device connectors 408 and the internal wall connectors 306 in any of a variety of manners that would be apparent to one of skill in the art in possession of the present disclosure. For example, cable(s) 900 may be non-releasably connected (e.g., soldered) to the networking processing device connectors 408 and the internal wall connectors 306, with the networking processing device connectors 408 mounted to the networking processing device board 402, and the internal wall connectors 306 connectable to the internal wall 304 (e.g., via coupling features provided on the internal wall 304) at block 802 to mount them to the internal wall 304. In another example, cable(s) 900 may be releasably connected to the networking processing device connectors 408 and/or the internal wall connectors 306, and may be connected to the networking processing device connectors 408 and/or the internal wall connectors 306 at block 802. In yet another example, the networking processing device connectors 408 and the internal wall connectors 306 may be non-releasably connected (e.g., soldered and glued, respectively) to the networking processing device board 402 and the internal wall 304, respectively, with the cable(s) 900 non-releasably connected (e.g., soldered) to the networking processing device connectors 408 and the internal wall connectors 306. While a few specific examples of the provisioning of the cable(s) 900 between the networking processing device connectors 408 and the internal wall connectors 306 have been described, it should be recognized that any method for providing cabling between connectors, particularly in a manner that reduces or even minimizes the loss of power in a signal transmitted through those connectors and that cabling (e.g., at a level sufficient to help eliminate the need for signal boosting PHY devices on the modular networking devices discussed below), will fall within the scope of the present disclosure.

Figure 9A:
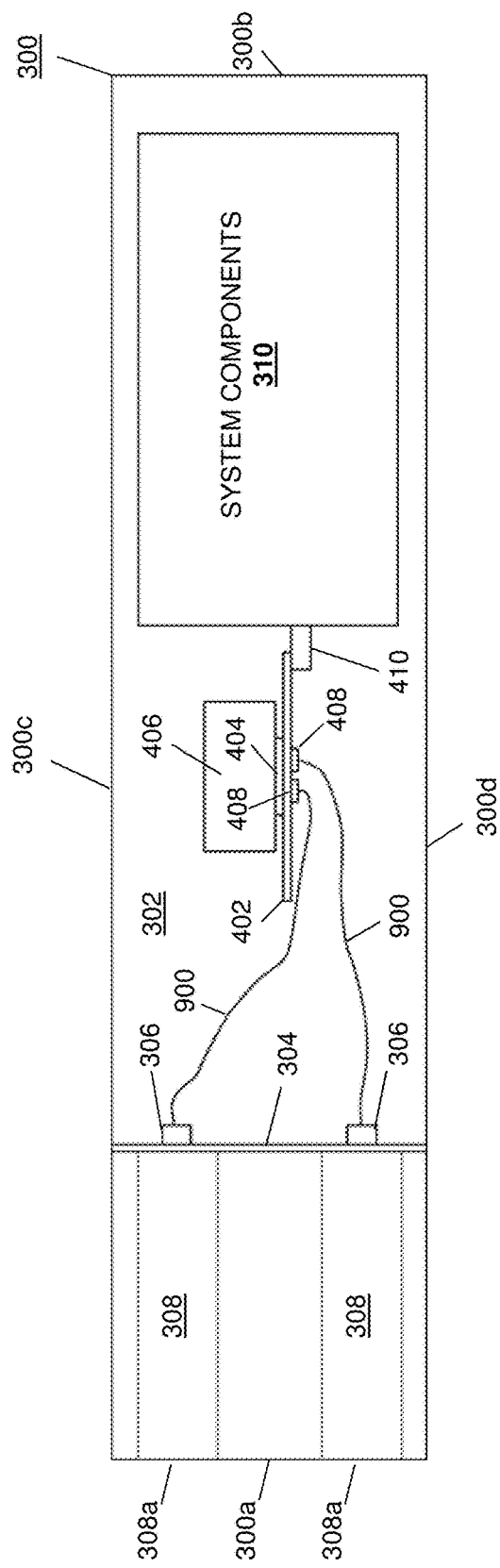
FIG. 9A is a side/partial schematic view illustrating an embodiment of the networking processing device of FIGS. 4A and 4B in the modular networking system chassis of FIG. 3.
Figure 9B:
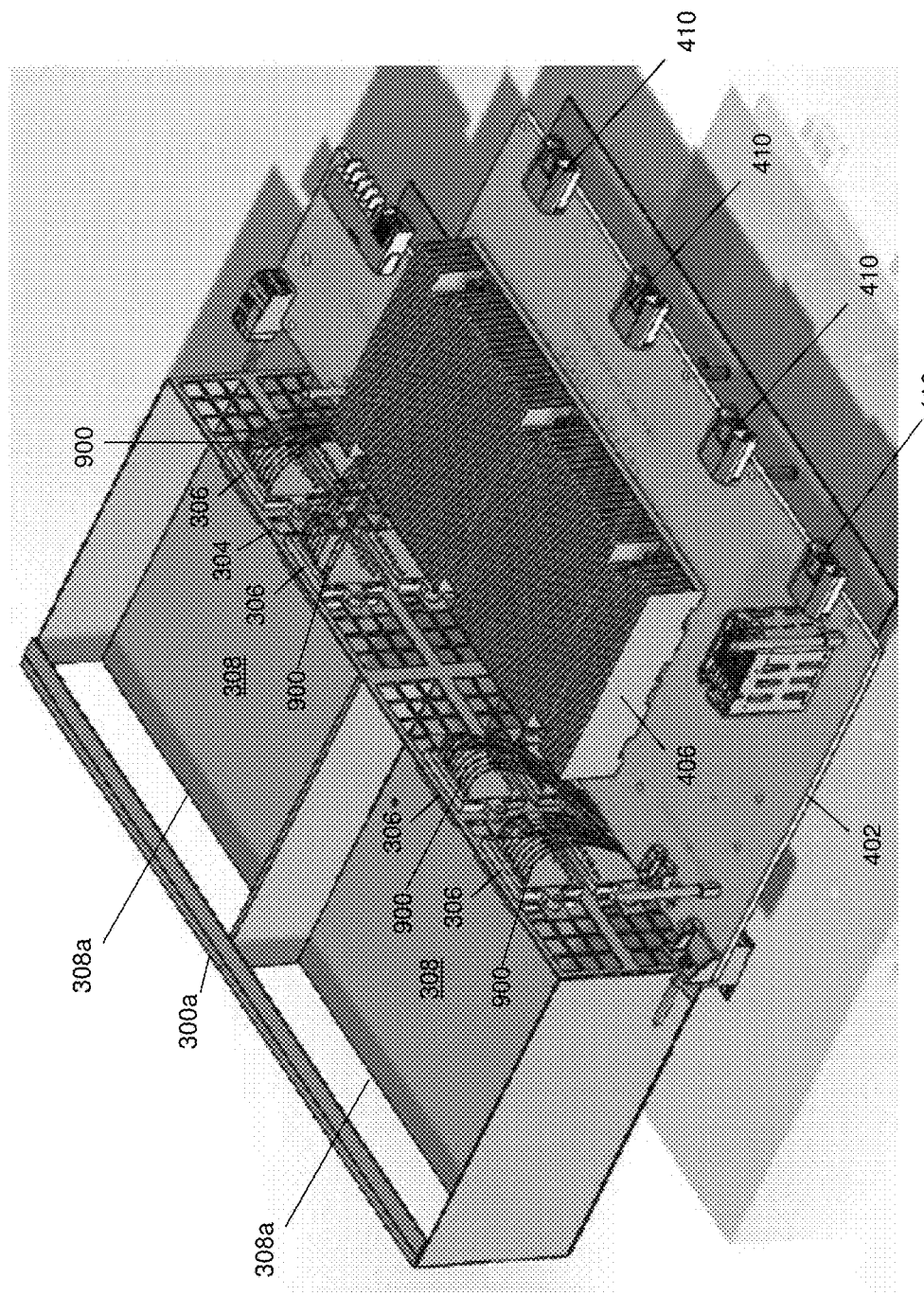
FIG. 9B is a perspective view illustrating an embodiment of a portion of the networking processing device in the modular networking system chassis of FIG. 9A.
Figure 9C:
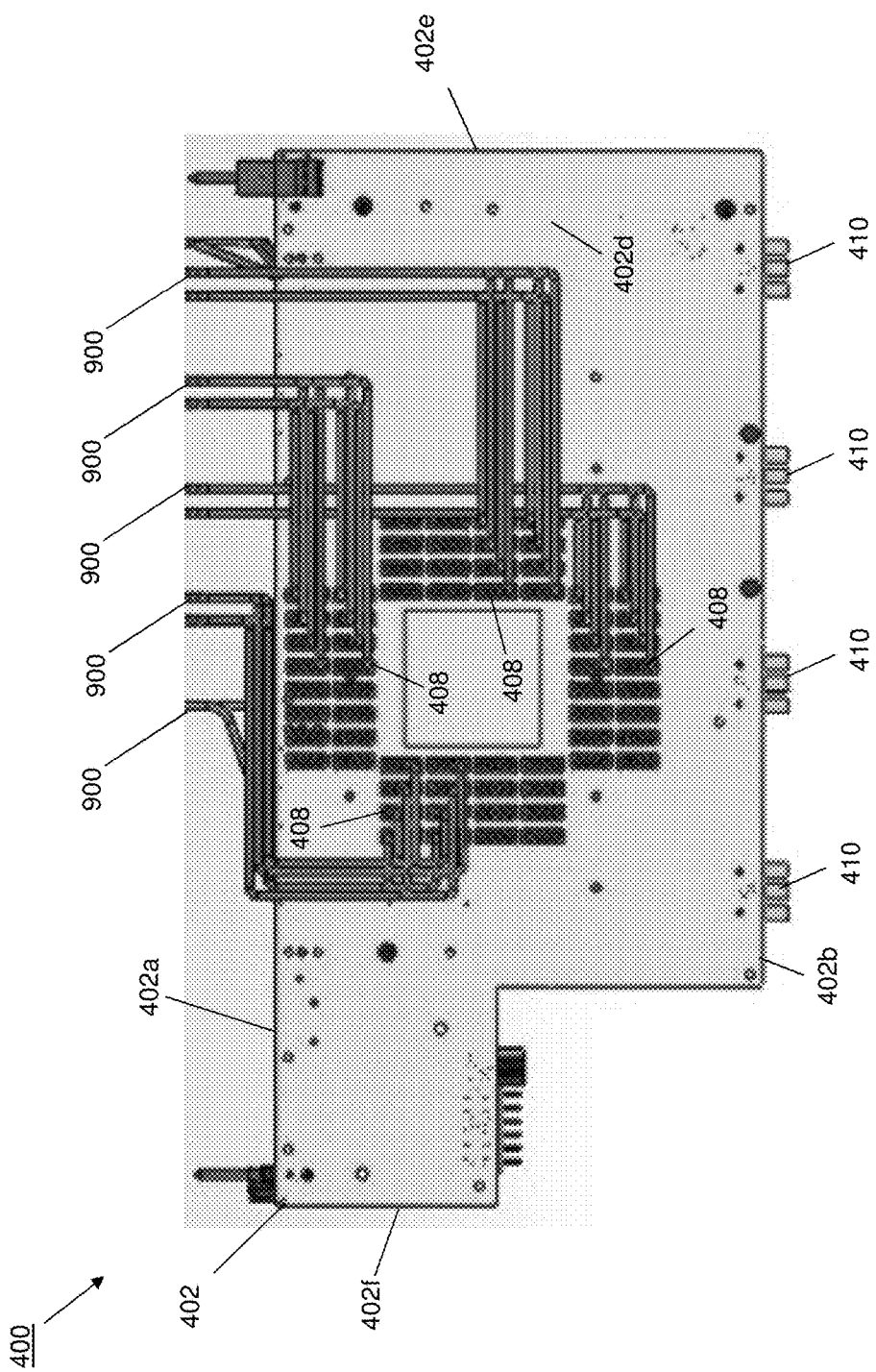
FIG. 9C is a bottom view illustrating an embodiment of a portion of the networking processing device of FIG. 9B.

FIG. 9B illustrates a specific embodiment of the networking processing device 400 positioned in and coupled to the modular networking system housing 302 defined by the modular networking system chassis 300, with the internal wall 304 including four internal wall connectors 306, and a plurality of cables 900 extending from each of the internal wall connectors 306. Furthermore, FIG. 9C illustrates a specific embodiment of the networking processing device board 402, showing the bottom surface 402d of the networking processing device board 402 with the networking processing device board connectors 408 coupled to the cables 900. One of skill in the art in possession of the present disclosure will recognize that the networking processing device board connectors 408 are illustrated in FIG. 9C as providing direct connections to the networking processor 404 provided on the top surface 402c of the networking processing device board 402 (e.g., by being located in the "footprint" of the networking processor 404 such that they are directly connected through the networking processing device board 402 to the networking processor 404). However, in other embodiments, the networking processing device board connectors 408 may be mounted to the networking processing device board 402 and connected to the networking processor 404 by traces in the networking processing device board 402, particularly in a manner that reduces or even minimizes the loss of power in a signal transmitted through those connectors and traces (e.g., at a level sufficient to help eliminate the need for signal boosting PHY devices on the modular networking devices discussed below.)

The method 800 then proceeds to block 804 where a modular networking device is received in the modular networking system chassis. In different embodiments, at block 804, any of the modular networking devices 500, 600, or 700, discussed above with reference to FIGS. 5A, 5B, 6A, 6B, and 7, may be received in the modular networking device slots 308 in the modular networking device housing 302 defined by the modular networking system chassis 300. For example, the modular networking device chassis 502, 602, or 702 may be positioned adjacent a modular networking device slot 308 with the rear wall 502b, 602b, or 702b, respectively, located immediately adjacent the modular networking device slot entrance 308a, and the modular networking device chassis 502, 602, or 702 is then moved towards the modular networking system chassis 300 such that it enters the modular networking device slot 308. As such, any of the modular networking devices may be received in any of the modular networking device slots 308 in the modular networking device housing 302 defined by the modular networking system chassis 300.

Figure 10B:
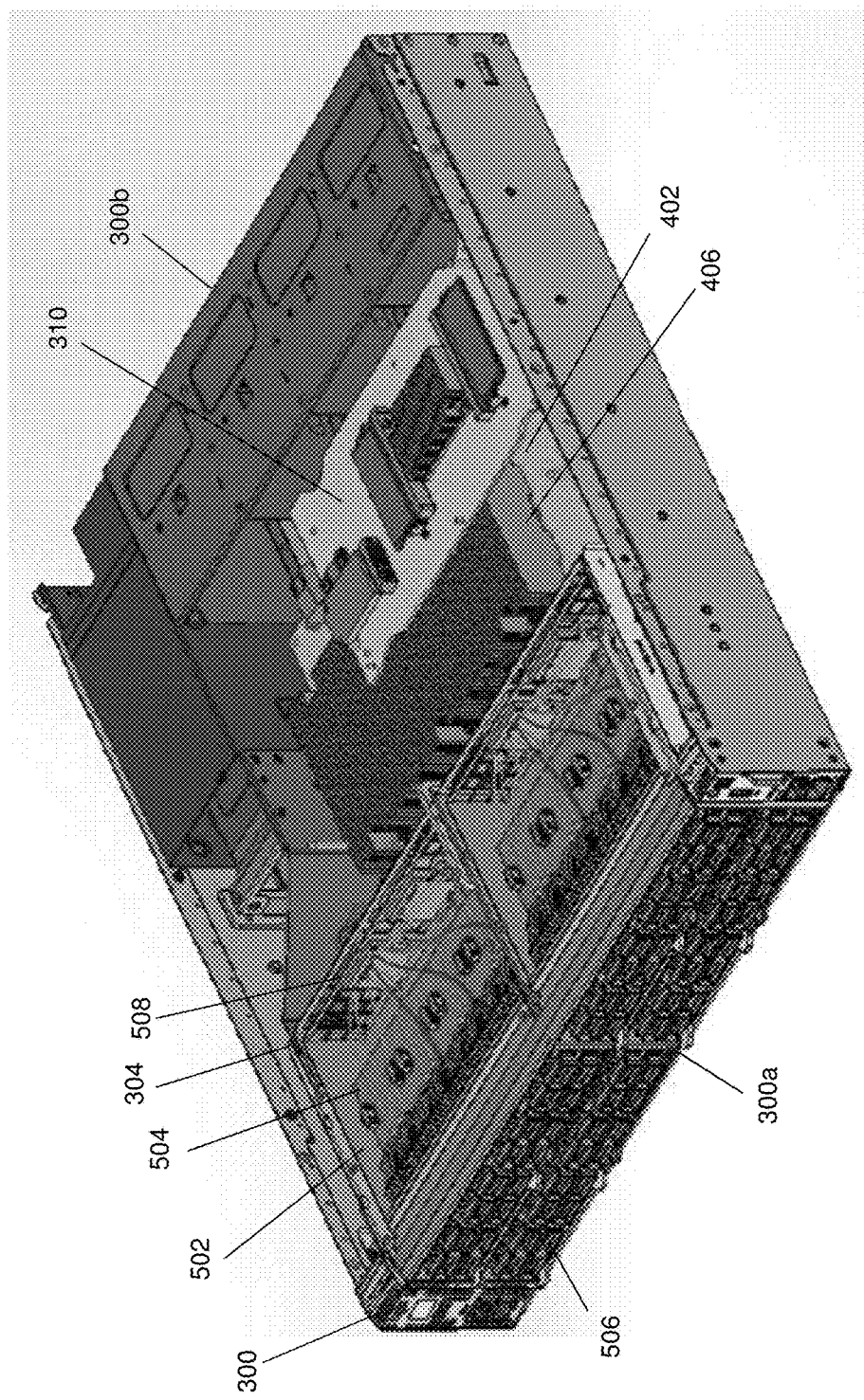
FIG. 10B is a perspective view illustrating an embodiment of the modular networking device connected to the networking processing deceive in the modular networking system chassis of FIG. 10A.
Figure 10C:
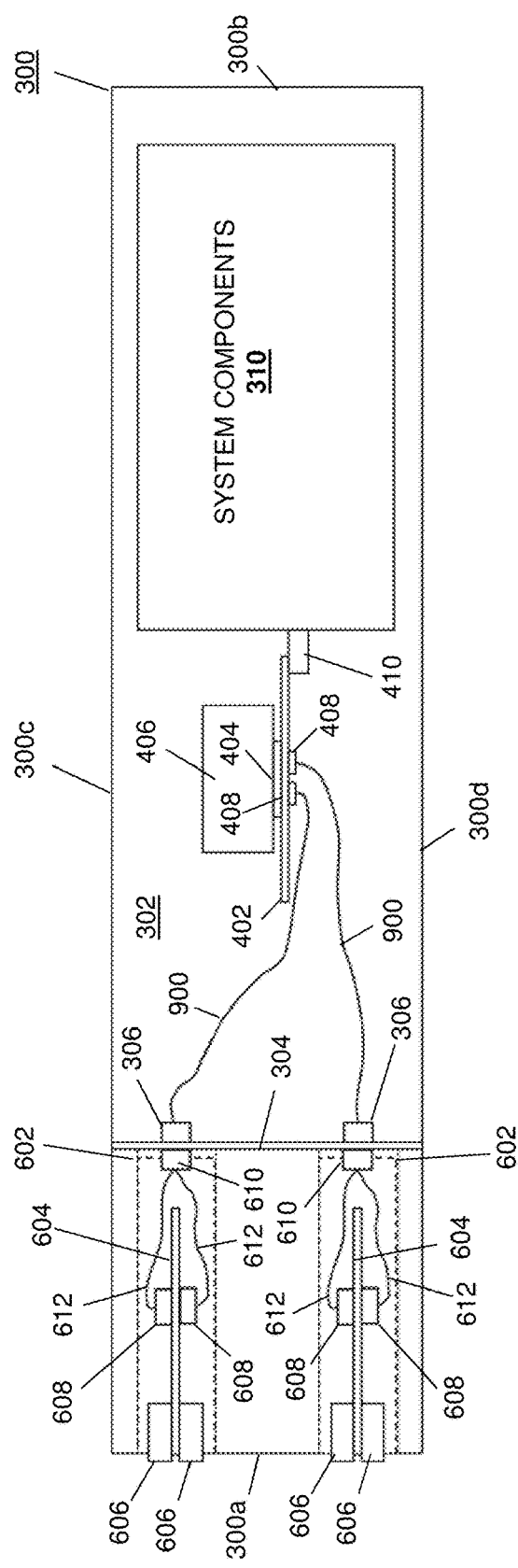
FIG. 10C is a side/partial schematic view illustrating an embodiment of the modular networking device of FIGS. 6A and 6B connected to the networking processing device in the modular networking system chassis of FIG. 9A.
Figure 10D:
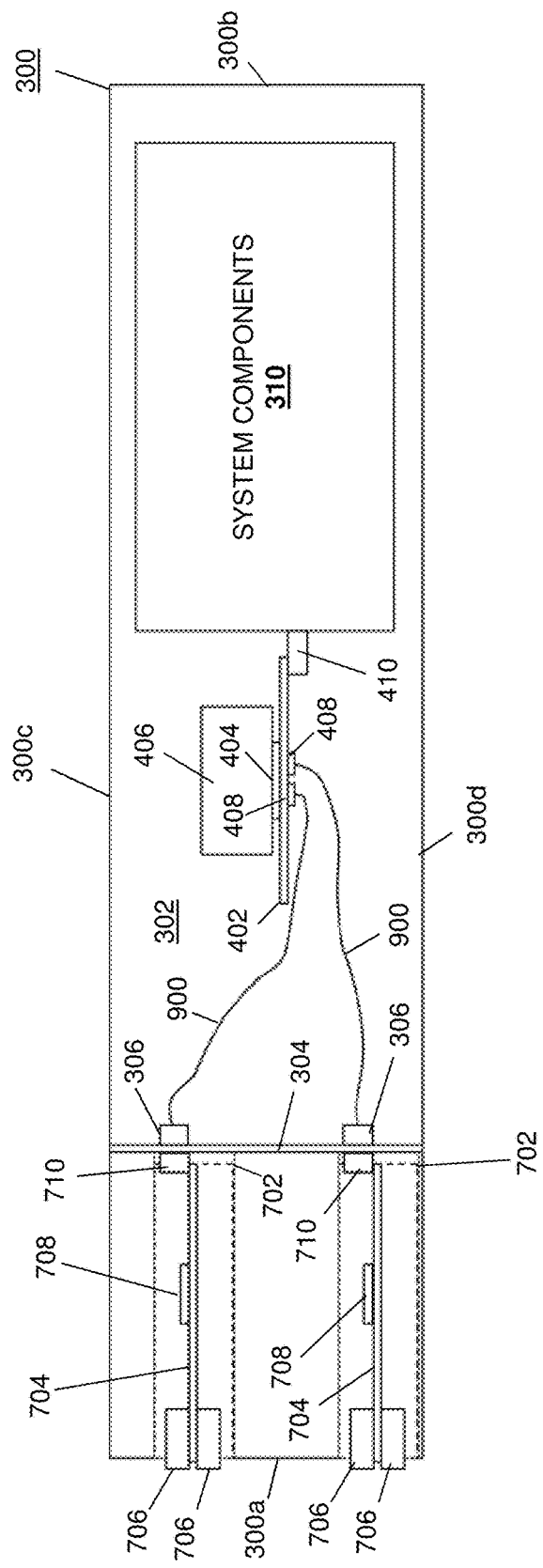
FIG. 10D is a side/partial schematic view illustrating an embodiment of the modular networking device of FIG. 7 connected to the networking processing device in the modular networking system chassis of FIG. 9A.

The method 800 then proceeds to block 806 where an internal wall connector is connected to a modular networking device internal connector. In different embodiments, at block 806, the movement of any of the modular networking devices 500, 600, or 700 into a modular networking device slot 308, discussed above with reference to 804, will cause the modular networking device internal connector 508, 610, or 710, respectively, to be connected to the internal wall connector 306 adjacent that modular networking device slot 308. For example, FIGS. 10A and 10B illustrate the modular networking device internal connector 508 on each modular networking device 500 connected to respective internal wall connectors 306. Similarly, FIG. 10O illustrates the modular networking device internal connector 610 on each modular networking device 600 connected to respective internal wall connectors 306, and FIG. 10D illustrates the modular networking device internal connector 710 on each modular networking device 700 connected to respective internal wall connectors 306.

The method 800 then proceeds to block 808 where signals are received through a modular networking device external connector and transmitted to a modular networking device internal connector. In different embodiments, at block 808, any of the modular networking devices 500, 600, or 700 located in a modular networking device slot 308 and connected to the internal wall connectors 306, discussed above with reference to 806, may receive signals through their modular networking device external connectors 506, 606, or 706, respectively, and transmit those signals to their modular networking device internal connectors 508, 610, and 710, respectively. For example, in the embodiment illustrated in FIGS. 10A and 10B, signals may be received through the modular networking device external connectors 506, and then transmitted through the cables 510 to the modular networking device internal connectors 508. Similarly, in the embodiment illustrated in FIG. 10O, signals may be received through the modular networking device external connectors 606, transmitted through trace(s) in the modular networking device board 604 to the modular networking device board connector 608, and then transmitted through the cables 612 to the modular networking device internal connectors 610. Similarly, in the embodiment illustrated in FIG. 10D, signals may be received through the modular networking device external connectors 706, transmitted through trace(s) in the modular networking device board 704 to the PHY device 708, and then transmitted through trace(s) in the modular networking device board 704 from the PHY device 708 to the modular networking device internal connectors 710. As discussed above, the PHY device 708 on the modular networking device 700 may be utilized to perform functionality that is not related to boosting the signal at block 808, as such signal boosting is not necessary when providing a modular networking device connection system utilizing the teachings of the present disclosure. However, some embodiments may include a signal-boosting PHY device if desired for a particular application.

The method 800 then proceeds to block 810 where signals are received from the modular networking device internal connector through the internal wall connector. In different embodiments, at block 810, the signals transmitted through the modular networking devices 500, 600, or 700, discussed above with reference to 808, are received at the internal wall connector 306. For example, in the embodiment illustrated in FIGS. 10A and 10B, signals may be received at the internal wall connectors 306 from the modular networking device internal connectors 508. Similarly, in the embodiment illustrated in FIG. 10O, signals may be received at the internal wall connectors 306 from the modular networking device internal connectors 610, and in the embodiment illustrated in FIG. 10D, signals may be received at the internal wall connectors 306 from the modular networking device internal connectors 710.

Figure 2A:
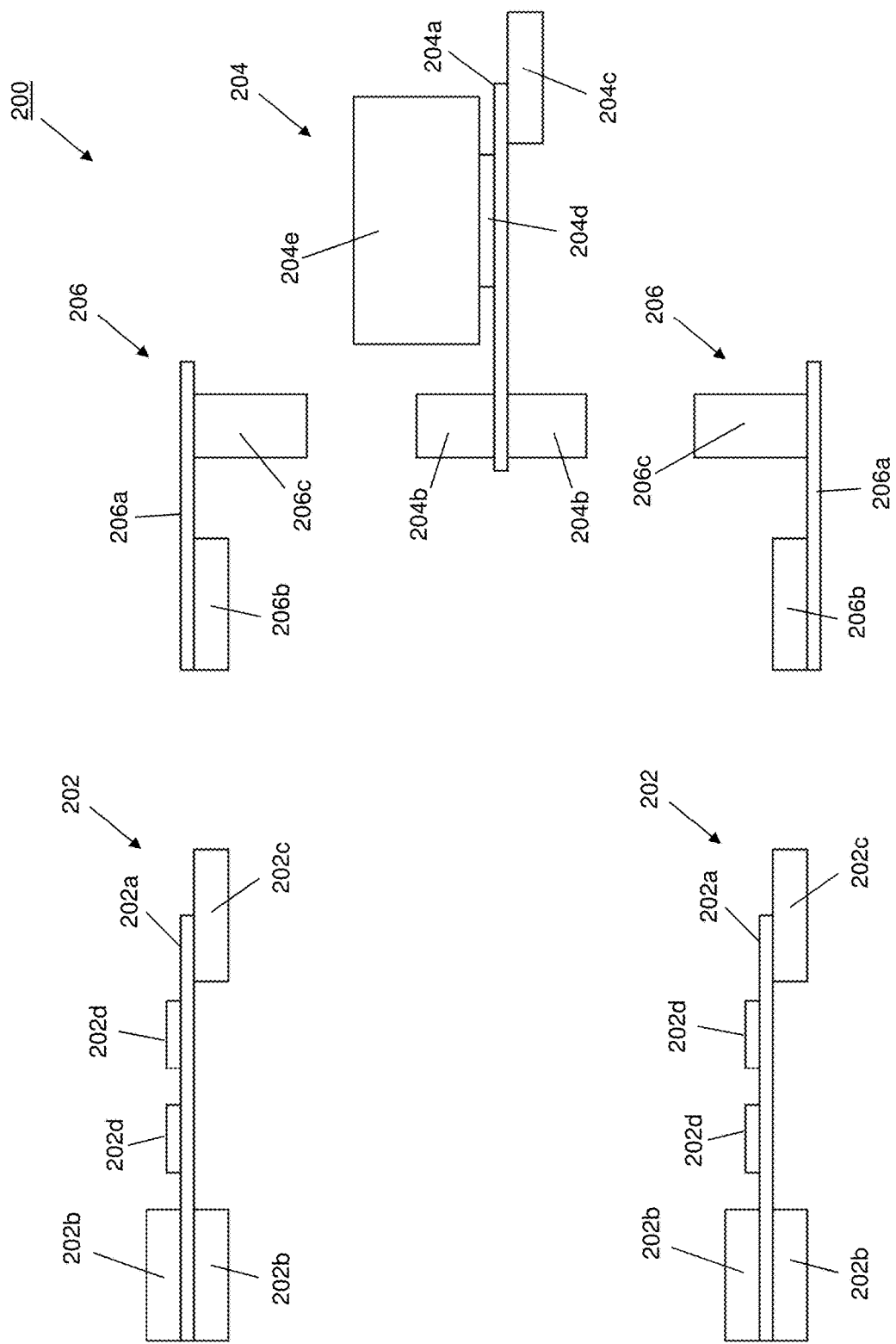
FIG. 2A is a schematic exploded view illustrating an embodiment of components of a conventional modular switch.
Figure 2B:
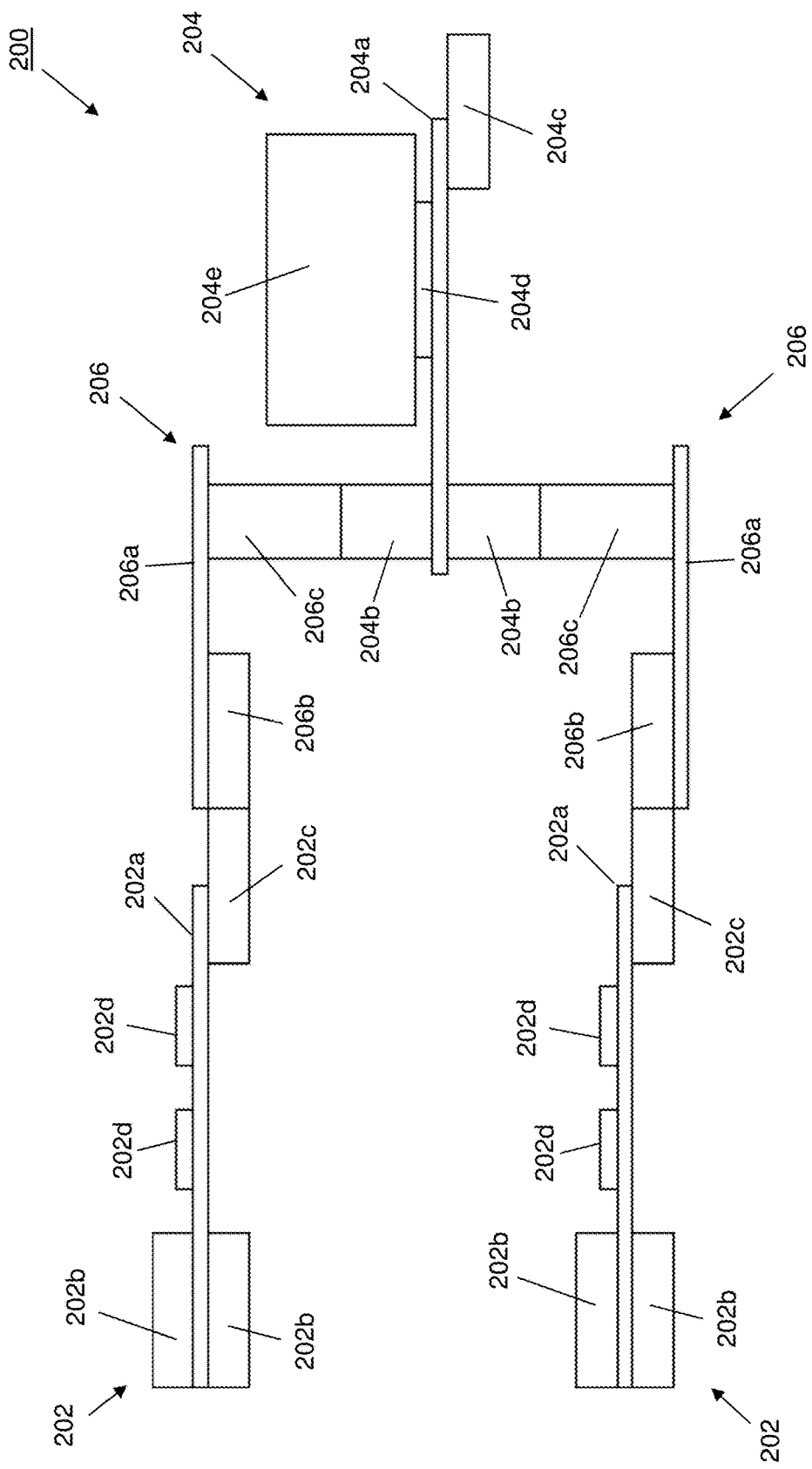
FIG. 2B is a schematic view illustrating an embodiment of a conventional modular switch with the components connected together.

The method 800 then proceeds to block 812 where signals are transmitted from the internal wall connector directly to a networking processing device connector using a cable. In any of the different embodiments discussed above, at block 812, the signals received at the internal wall connectors 306 may be transmitted through the cable(s) 900 to the networking processing device connectors 408. As discussed above, the cable(s) 900 between the internal wall connectors 306 and the networking processing device connectors 408 are provided in a manner that reduces or even minimizes the loss of power in the signal transmitted through the internal wall connectors 306, the cable(s) 900, and to the networking processing device connectors 408. As such, any power loss resulting from the transmission of those signals at block 812 is at a level that is sufficient to eliminate the need for signal boosting PHY devices on the modular networking devices 500 and 600 (which are otherwise required when that signal must be transmitted through the connection devices 206 discussed above with reference to FIGS. 2A and 2B.) However, as discussed above, a PHY device may be include on the modular networking device 700 to boost signals is desired for a particular modular networking device design (e.g., a line card design).

The method 800 then proceeds to block 814 where signals are provided from the networking processing device connector to a networking processor. In any of the different embodiments discussed above, at block 814, the signals received at the networking processing device connectors 408 may be provided through the networking processing device board 402 to the networking processor 404. As discussed above, the networking processing device board connectors 408 may provide direct connections to the networking processor 404 (e.g., by being located in the "footprint" of the networking processor 404 such that they are directly connected through the networking processing device board 402 to the networking processor 404), or may be mounted to the networking processing device board 402 and connected to the networking processor 404 by traces in the networking processing device board 402 in a manner that reduces or even minimizes the loss of power in a signal transmitted through those connectors and traces (e.g., at a level sufficient to help eliminate the need for signal boosting PHY devices on the modular networking devices discussed below.) As such, at block 814, the networking processor 404 receives the signals that were provided to the modular networking device external connectors 506, 606, or 706 at block 808. Following block 814, the networking processor 404 may process those signals and, for example, provide the processed signals through trace(s) on the networking processing device board 402 and the system component connectors 410 to the system components 310, or back out to external devices (e.g., by following the blocks 808-814 of the method 800 in reverse order.)

Figure 11:
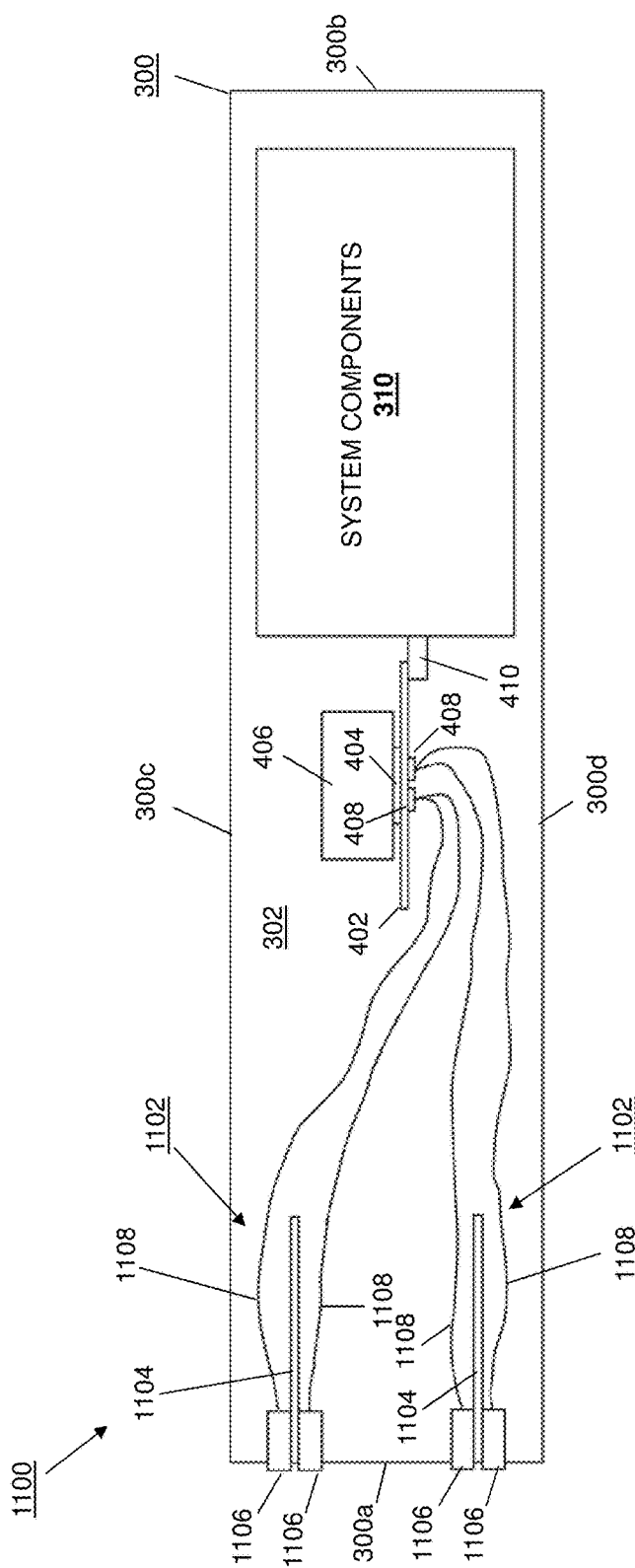
FIG. 11 is a side/partial schematic view illustrating an embodiment of a non-modular networking system utilizing the teachings of the present disclosure.

Referring to FIG. 11, an embodiment of a networking system 1100 is illustrated that utilizes the teachings of the present disclosure in a non-modular system. In the illustrated embodiment, a plurality of networking devices 1102 (e.g., line cards) are mounted in the networking system chassis 300 such that they are not easily removable from the networking device chassis 300 (e.g., as compared to the modular networking device discussed above). Each of the networking devices 1102 includes a networking device board 1104 having a plurality of networking device connectors 1106 mounted to the networking device board 1104 and positioned such that they are accessible on the front wall 300a of the networking system chassis 300. One or more cable(s) 1108 are provided between the networking device connectors 1106 and the networking processing device connectors 408, and may be provided in substantially the same manner as discussed above for the cables 510, 612, and/or 900. One of skill in the art in possession of the present disclosure will recognize how signals received the networking device connectors 1106 may be transmitted through the cables 1108 to the networking processing device connectors 408, and then through the networking processing device board 402 to the networking processor 404, in substantially the same manner as discussed above in the method 800.

Thus, systems and methods have been described that provide connections in a modular networking system between a modular networking device and a networking processing device that reduce the power losses present in conventional modular networking systems, thus eliminating the need for signal boosting PHY devices on the modular networking devices, and reducing costs, power, thermal issues, and signal delays. For example, in some experimental embodiments, the modular networking device connection system of the present disclosure has been found to reduce the signal power losses present in conventional modular networking device connection systems by approximately 75%. In some embodiments, such benefits are realized by replacing conventional circuit board based connection devices with a direct cabled connection between networking processing device connector on the networking processing device, and an internal wall connector that connects directly to the modular networking device (when that modular networking device is coupled to the modular networking system.) Direct cabled connections may be provided between external and internal connectors on the modular networking device as well, although a variety of different modular networking devices may be provided in a variety of configurations without requiring a signal boosting PHY device to re-drive and re-time the signal so that it may be received by the networking processing device with a signal strength that is sufficient for processing.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A modular networking device connection system, comprising:
   a modular networking system chassis that defines a modular networking system housing including a modular networking device slot;
   an internal wall that is located in the modular networking system housing immediately adjacent the modular networking device slot, wherein the internal wall includes a internal wall connector that is configured to connect to a modular networking device positioned in the modular networking device slot; and
   a networking processing device that is located in the modular networking system housing opposite the internal wall from the modular networking device slot, wherein the networking processing device includes:
     a networking processing device board;
     a networking processor that is mounted to the networking processing device board; and
     a networking processing device connector that is mounted to the networking processing device board and coupled to the networking processor through the networking processing device board, wherein the networking processing device connector is directly connected to the internal wall connector by a first cable that is configured to transmit signals received through the internal wall connector directly to the networking processing device connector for provision to the networking processor via the networking processing device board.

2. The system of claim 1, further comprising:
   a modular networking device that is configured to be positioned in the modular networking device slot, wherein the modular networking device includes:
     a modular networking device chassis that defines a modular networking device housing;
     a modular networking device board that is located in the modular networking device housing;
     a modular networking device external connector that is mounted to the modular networking device board and accessible on the modular networking device chassis; and
     a modular networking device internal connector that is located on the modular networking device chassis and configured to connect to the internal wall connector when the modular networking device is positioned in the modular networking device slot, wherein the modular networking device internal connector is directly connected to the modular networking device external connector by a second cable that is configured to transmit signals received through the modular networking device external connector directly to the modular networking device internal connector.

3. The system of claim 2, wherein the modular networking device board is free of a signal boosting physical layer (PHY) device.

4. The system of claim 1, further comprising:
   a modular networking device that is configured to be positioned in the modular networking device slot, wherein the modular networking device includes:
     a modular networking device chassis that defines a modular networking device housing;
     a modular networking device board that is located in the modular networking device housing;
     a modular networking device external connector that is mounted to the modular networking device board and accessible on the modular networking device chassis; and
     a modular networking device internal connector that is mounted to the modular networking device board, accessible on the modular networking device chassis, and configured to connect to the internal wall connector when the modular networking device is positioned in the modular networking device slot, wherein the modular networking device internal connector is directly connected to the modular networking device external connector by at least one trace in the modular networking device board that is configured to transmit signals received through the modular networking device external connector directly to the modular networking device internal connector.

5. The system of claim 4, wherein the modular networking device board is free of a signal boosting physical layer (PHY) device.

6. The system of claim 1, further comprising:
   a modular networking device that is configured to be positioned in the modular networking device slot, wherein the modular networking device includes:
     a modular networking device chassis that defines a modular networking device housing;
     a modular networking device board that is located in the modular networking device housing;
     a modular networking device external connector that is mounted to the modular networking device board and accessible on the modular networking device chassis;
     a modular networking device board connector that is mounted to the modular networking device board and that is configured to receive signals from the modular networking device external connector through at least one trace in the modular networking device board; and
     a modular networking device internal connector that is located on the modular networking device chassis and configured to connect to the internal wall connector when the modular networking device is positioned in the modular networking device slot, wherein the modular networking device internal connector is directly connected to the modular networking device board connector by a second cable that is configured to transmit signals received from the modular networking device board connector directly to the modular networking device internal connector.

7. The system of claim 1, wherein the modular networking device board is free of a signal boosting physical layer (PHY) device.

8. An Information Handling System (IHS), comprising:
   a modular networking system chassis that defines a modular networking system housing;

an internal wall that is located in the modular networking system housing and that includes a internal wall connector;

a modular networking device that is located in the modular networking system housing and connected to the internal wall connector; and a networking processing device that is located in the modular networking system housing opposite the internal wall from the modular networking device, wherein the networking processing device includes:

a networking processing device board;

a networking processor that is mounted to the networking processing device board; and a networking processing device connector that is mounted to the networking processing device board and coupled to the networking processor through the networking processing device board, wherein the networking processing device connector is directly connected to the internal wall connector by a first cable that transmits signals received from the modular networking device and through the internal wall connector directly to the networking processing device connector for provision to the networking processor via the networking processing device board.

9. The IHS of claim 8, wherein the modular networking device includes:

a modular networking device chassis that defines a modular networking device housing;

a modular networking device board that is located in the modular networking device housing;

a modular networking device external connector that is mounted to the modular networking device board and accessible on the modular networking device chassis; and a modular networking device internal connector that is located on the modular networking device chassis and connected to the internal wall connector, wherein the modular networking device internal connector is directly connected to the modular networking device external connector by a second cable that transmits signals received through the modular networking device external connector directly to the modular networking device internal connector.

10. The IHS of claim 9, wherein the modular networking device board is free of a signal boosting physical layer (PHY) device.

11. The IHS of claim 8, wherein the modular networking device includes:

a modular networking device chassis that defines a modular networking device housing;

a modular networking device board that is located in the modular networking device housing;

a modular networking device external connector that is mounted to the modular networking device board and accessible on the modular networking device chassis; and a modular networking device internal connector that is mounted to the modular networking device board, accessible on the modular networking device chassis, and connected to the internal wall connector, wherein the modular networking device internal connector is directly connected to the modular networking device external connector by at least one trace in the modular networking device board that transmits signals received through the modular networking device external connector directly to the modular networking device internal connector.

12. The IHS of claim 11, wherein the modular networking device board is free of a signal boosting physical layer (PHY) device.

13. The IHS of claim 8, wherein the modular networking device includes:

a modular networking device chassis that defines a modular networking device housing;

a modular networking device board that is located in the modular networking device housing;

a modular networking device external connector that is mounted to the modular networking device board and accessible on the modular networking device chassis;

a modular networking device board connector that is mounted to the modular networking device board and that receives signals from the modular networking device external connector through at least one trace in the modular networking device board; and a modular networking device internal connector that is located on the modular networking device chassis and connected to the internal wall connector, wherein the modular networking device internal connector is directly connected to the modular networking device board connector by a second cable that transmits signals received from the modular networking device board connector directly to the modular networking device internal connector.

14. The IHS of claim 13, wherein the modular networking device board is free of a signal boosting physical layer (PHY) device.

15. A method for providing modular networking devices in a modular networking system, comprising:

receiving a modular networking device in a modular networking device slot that is part of a modular networking system housing defined be a modular networking system chassis;

connecting an internal wall connector on an internal wall that is located in the modular networking system housing to a modular networking device internal connector on the modular networking device;

receiving, by the internal wall connector from the modular networking device internal connector, signals transmitted through the modular networking device;

transmitting the signals through a first cable that directly connects the internal wall connector to a networking processing device connector that is mounted to a networking processing device board that includes a networking processor; and providing the signals from the networking processing device connector to the networking processor via the networking processing device board.

16. The method of claim 15, further comprising:

receiving, by a modular networking device external connector on the modular networking device, the signals;

transmitting the signals through a second cable that directly connects the modular networking device external connector to a modular networking device internal connector that is connected to the internal wall connector; and providing the signals from the modular networking device internal connector to the internal wall connector.

17. The method of claim 16, wherein the modular networking device board is free of a signal boosting physical layer (PHY) device.

18. The method of claim 15, further comprising:
- receiving, by a modular networking device external connector on the modular networking device, the signals;
- transmitting the signals through at least one trace in a modular networking device board that directly connects the modular networking device external connector to a modular networking device internal connector that is connected to the internal wall connector; and
- providing the signals from the modular networking device internal connector to the internal wall connector.

19. The method of claim 18, wherein the modular networking device board is free of a signal boosting physical layer (PHY) device.

20. The method of claim 15, further comprising:
- receiving, by a modular networking device external connector on the modular networking device, the signals;
- transmitting the signals through at least one trace in a modular networking device board that directly connects the modular networking device external connector to a modular networking device board connector;
- transmitting the signals through a second cable that directly connects the modular networking device board connector to a modular networking device internal connector that is connected to the internal wall connector; and
- providing the signals from the modular networking device internal connector to the internal wall connector.

\* \* \* \* \*